(12) United States Patent
Beghin et al.

(10) Patent No.: US 6,313,040 B1
(45) Date of Patent: Nov. 6, 2001

(54) PROCESS FOR THE DEFINITION OF OPENINGS IN A DIELECTRIC LAYER

(75) Inventors: Lorena Beghin, Villasanta; Francesca Canali, Saronno; Francesco Cazzaniga, Seveso; Luca Riva, Monza; Carmelo Romeo, Vimercate, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/406,903

(22) Filed: Sep. 28, 1999

(30) Foreign Application Priority Data

Sep. 28, 1998 (EP) .................................................. 98830564

(51) Int. Cl.[7] .................................................. H01L 21/302
(52) U.S. Cl. .......................... 438/705; 438/704; 438/734; 430/5; 216/57; 216/62
(58) Field of Search .................................. 430/5; 438/704, 438/719, 755, 705, 734; 216/62, 76, 80, 87, 100, 57

(56) References Cited

U.S. PATENT DOCUMENTS

| | | | |
|---|---|---|---|
| 4,378,628 | 4/1983 | Levinstein et al. | 29/571 |
| 5,279,990 | 1/1994 | Sun et al. | 437/195 |
| 5,466,638 | 11/1995 | Eguchi | 437/193 |
| 5,468,342 | * 11/1995 | Nulty et al. | 156/643.1 |
| 5,482,882 | * 1/1996 | Lur et al. | 437/52 |
| 5,719,089 | 2/1998 | Cherng et al. | 438/637 |
| 5,945,350 | * 8/1999 | Violette et al. | 438/706 |

OTHER PUBLICATIONS

European Search Report from European Patent Application 98830564.5, filed Sep. 28, 1998.
Shih Wei Sun, et al. "A Polysilicon Hard–Mask/Spacer Process For Sub–0.5 Micron ULSI Contacts" Journal of the Electrochemical Society, vol. 138, No. 2, Feb. 1, 1991, pp 619–620.
Patent Abstracts of Japan, vol. 007, No. 013 (E–153), Jan. 19, 1983 & JP–A–57 172737 (Oki Denki Kogyo KK).

* cited by examiner

Primary Examiner—Marian C. Knode
Assistant Examiner—George Goudreau
(74) Attorney, Agent, or Firm—Wolf, Greenfield & Sacks, P.C.; James H. Morris; Theodore E. Galanthay

(57) ABSTRACT

A process for etching a dielectric layer, including the steps of forming, over the dielectric layer, a layer of polysilicon, forming over the layer of polysilicon a photoresist mask layer, etching the layer of polysilicon using the photoresist mask layer as an etching mask for selectively removing the layer of polysilicon, removing the photoresist mask layer from over the layer of polysilicon, etching the dielectric layer using the layer of polysilicon as a mask. Subsequently, the layer of polysilicon is converted into a layer of a transition metal silicide, and the layer of transition metal silicide is etched for selectively removing the latter from over the dielectric layer.

7 Claims, 2 Drawing Sheets

PROCESS FOR THE DEFINITION OF OPENINGS IN A DIELECTRIC LAYER

BACKGROUND OF THE INVENTION

Field of the Invention

The present invention relates to the manufacturing of integrated circuits. More particularly, the invention relates to a process for defining openings in a dielectric layer, for example a process for defining contact openings to allow electrical interconnections to contact active elements.

Any integrated circuit, be it a memory device such as an EPROM or a Flash EEPROM, or a power device, generically comprises at least an active element, e.g. exploiting the features of the metal-oxide-semiconductor system properties, and electrical interconnections, normally formed by an aluminum alloy, for allowing the operation of the active element. The active element and the electrical interconnections communicate by means of contacts.

The contacts allow for accessing e.g. a memory cell in a memory device, or a transistor of a logic circuit. The number of contacts in an integrated circuit may range from some hundred thousands to some tens millions. Therefore, the degree of defectivity, i.e. the number of malfunctioning contacts, is probably the main parameter for estimating the yield of a manufacturing process.

The contacts must have an ohmic behavior, that means when the voltage applied is varied, the measured current must follow Ohm's law.

The reduction in size of the devices involves the capability of making contacts so small as 0.25 μm in the last generation of devices. This can only be achieved by a fine control of each step of the manufacturing of contacts, i.e. lithography, etching and removal of material.

The lithographic process allows for defining the contact by exposure of a chrome mask over a photoresist layer. The light passing through the mask is focused onto the photoresist layer by a system of lenses. The exposed areas of the photoresist layer are then dissolved by a basic developing solution. A good lithographic process must guarantee the size stability of the structure opened in the photoresist layer in respect of varying focal length and light intensity.

The most advanced exposure techniques (Deep Ultra Violet or DUV) makes use of light sources formed by excimer lasers emitting light in the ultraviolet region of the spectrum (248 nm). Almost all of the photoresist materials which are sensitive to light of such wavelengths are easily contaminated, due to the presence in the environment of substances such as ammonia and amines, or by coming into contact with some particular kind of substrates. Such contamination has, as a consequence, a bad definition of the openings to be formed in the photoresist layer, and the presence of undesired residual parts (t-topping and footing).

The contacts are often defined in a dielectric layer, typically BPSG—Boron-Phosphorus Silicon Glas). BPSG is a strong contaminant agent for the photoresist materials. The common solution to this problem provides for interposing between the photoresist layer and the BPSG layer thin, undoped dielectric layers such as TEOS, or anti-reflecting material layers, either organic or inorganic.

However, this solution can introduce defects in the contacts, and pose problems in the integration.

During the etching step, the contacts previously defined photolithographically in the photoresist layer are opened in the underlying dielectric layer, e.g. the BPSG, so to allow the metal interconnection which will be formed over the dielectric layer to come into contact with the underlying semiconductor. The etching step is performed by means of a plasma containing active species that act through a combined chemical-physical action. This action must be selective with respect to the photoresist layer. When the dimensions of the contacts are so small as to require photoresist materials suitable for DUV exposure, the conventional chemical compositions used for the etching step have shown to be poorly selective, with a consequent lost of contact size control.

The process of removal of the photoresist layer provides for an $O_2/N_2$ plasma etching that eliminates almost all of the photoresist, followed by a wet treatment with $H_2O_2/NH_4OH$ for removing possible residual parts. However, this last treatment involves an isotropical etch of the contact walls, widening the contact size of approximately 25%.

A technique has been proposed for overcoming these problems, specifically for avoiding the loss of size control and for increasing the lithographic resolution of the contact. This technique provides for depositing, over the dielectric layer (e.g., the BPSG) a layer of polysilicon. The polysilicon layer is then used as an inorganic mask. The polysilicon layer prevents contamination of the photoresist layer by the dielectric. The polysilicon layer also increases the dimensional stability even varying the focal length of the lens system for the projection of the mask. The reflectivity of the polysilicon layer allows for using lower light intensity, thus reducing the heating of the lenses. Additionally, the reflectivity of the polysilicon layer allows for less residual parts at the bottom of the contact. The main feature of the use of a polysilicon layer is the high selectivity of the polysilicon etching step compared to that of the photoresist. This allows for using thin photoresist layers, thus significantly increasing the focal depth and the capability of opening contacts of smaller dimension.

According to the above technique, a polysilicon layer is firstly deposited over the dielectric layer wherein the contacts have to be opened. A photoresist layer is then deposited over the polysilicon layer. The photoresist layer is then exposed to a light source by means of a mask, and it is developed. A basic solution allows for selectively removing the photoresist layer. Then, a plasma etching process is performed, and the polysilicon layer is etched where the photoresist layer has been removed. Contact openings are thus defined in the polysilicon layer. During the plasma etching high-energy ions hit the polysilicon layer along a direction orthogonal to the surface thereof. The neutral radicals in the plasma isotropically reach the surface of the device along all the directions, and determine chemical reactions. The byproducts of the reactions are mostly volatile gases that are desorbed by the surface, and removed from the etching area. The presence of non-volatile reaction products, that cannot be easily removed, causes a polymerization that often translates into an increased defectivity. The high selectivity with respect to the photoresist reduces the formation of a layer of non-volatile reaction products, thus minimizing the polymerization and assuring the formation of a thin lateral wall protecting the profiles of the isotropical etch. The high selectivity with respect to the photoresist and the underlying dielectric layer also allow for preserving the photolithographic dimensions and the substrate integrity during the whole etching process. Then, the photoresist layer is completely removed, without modifying the etch profile. The polysilicon layer is now ready for acting as an inorganic mask for the etching of the underlying dielectric layer.

Contacts are opened in the dielectric layer by means of a plasma etch. This etch must assure the least loss of size control, a high selectivity with respect to the dielectric layer and a vertical profile of the contact to be formed. The polysilicon mask is extremely advantageous compared to the conventional photoresist masks used for DUV photolithography. In fact, selectivity of the dielectric layer etch with respect to polysilicon is at least four times higher than that obtained with the DUV photoresist. This allows for almost perfectly maintaining the dimensions of the contact (the dimensional loss is almost zero), and also has the great advantage of allowing the deposition of an extremely thin polysilicon layer, thus making it easier to control the polysilicon etching for the formation of the polysilicon mask.

During the etching of the dielectric layer by means of the conventional photoresist mask the interaction of the chemical species with the photoresist produces polymer non-volatile reaction products which can act as a barrier to the etching follow-up (etch-stop); this phenomenon is the more frequent the smaller the contact. Contrarily, using the polysilicon mask, as a result of the high selectivity of the etching process and the different chemical composition of the material, the degree of the polymerization is so small so as to completely prevent the etch-stop. So, the use of a polysilicon mask is particularly suitable for the formation of contacts of critical dimensions and high aspect ratios.

Once the etching of the dielectric layer is completed and the contact openings have been formed, the polysilicon layer has to be removed.

However, a complete etch and removal of the polysilicon layer negatively affects the contact functionality, since the silicon substrate at the bottom of the contact opening is damaged.

An object of the present invention to provide a process for etching a dielectric layer which is not affected by all of the above mentioned problems.

SUMMARY OF THE INVENTION

According to the present invention, this and other objects are achieved by a process for etching a dielectric layer, including the steps of forming, over the dielectric layer a layer, of polysilicon, forming over the layer of polysilicon a photoresist mask layer, etching the layer of polysilicon using the photoresist mask layer as an etching mask for selectively removing the layer of polysilicon, removing the photoresist mask layer from over the layer of polysilicon, etching the dielectric layer using the layer of polysilicon as a mask, converting the layer of polysilicon into a layer of a transition metal silicide, and etching the layer of transition metal silicide for selectively removing the latter from over the dielectric layer.

BRIEF DESCRIPTION OF THE DRAWINGS

The features and advantages of the present invention will be made apparent by the following detailed description of one embodiment thereof, illustrated by way of a non-limiting example only in the annexed drawings, wherein.

DETAILED DESCRIPTION

Figure 1:
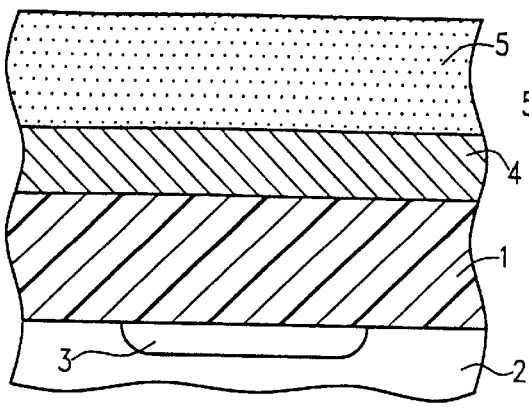
FIGS. 1 to 10 show in cross-section some steps of a process according to the present invention.

With reference to FIG. 1, a dielectric layer 1, e.g. a BPSG layer, is deposited by conventional techniques over, e.g., a semiconductor substrate 2 wherein a doped region 3 to be contacted by a metallization is provided. Then, a polysilicon layer 4 is deposited over the dielectric layer 1. If necessary, e.g. for defining contacts of 0.25 μm or less, an anti-reflecting layer can be deposited over the polysilicon layer.

Over the polysilicon layer 4, a photoresist layer 5 is deposited, e.g. a DUV photoresist layer suitable for Deep Ultra-Violet light exposure.

Figure 2:
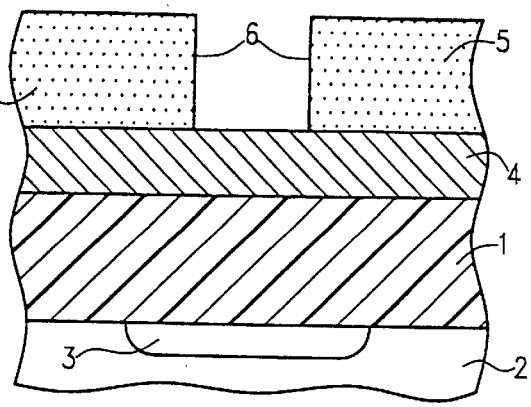

With reference to FIG. 2, the photoresist layer 5 is selectively exposed to a light source through a mask, and subsequently the exposed region is dissolved by a basic develop solution, so as to open a window 6.

Figure 3:
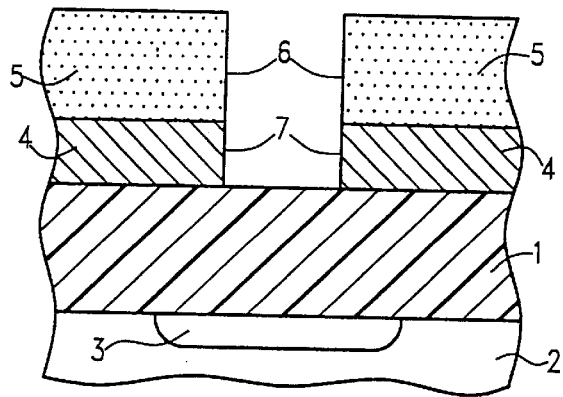

With reference to FIG. 3, an etching process is then performed to remove the polysilicon layer 4 from the region under the window 6. The etching process is normally a plasma etching. High energy ions hit the exposed polysilicon layer and chemical reactions take place. The etching is highly selective with respect to the photoresist layer, in the sense that almost only the polysilicon layer, and not the photoresist layer, is etched. The etching is also highly selective with respect to the underlying dielectric layer 1, so that when all of the polysilicon layer 4 has been removed from under the window 6, the etching automatically stops and the dielectric layer 1 is not affected. At the end of the etching process, a window 7 is formed in the polysilicon layer, the window 7 being almost perfectly aligned with the window 6 in the photoresist layer 5.

Figure 4:
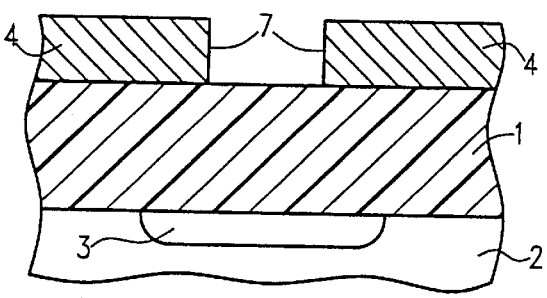

With reference to FIG. 4, the photoresist layer 5 is then removed from over the polysilicon layer 4. During the removal of the photoresist layer, the shape of the window 7 in the polysilicon layer is not altered at all.

Figure 5:
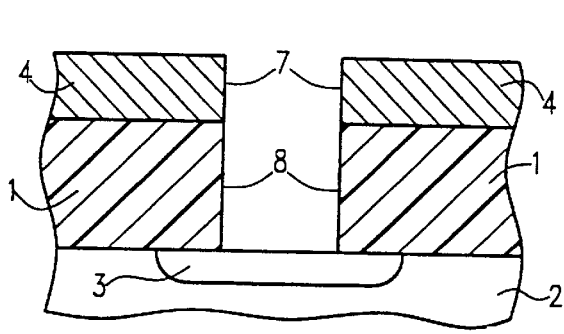

With reference to FIG. 5, an etching process is then performed using the polysilicon layer 4 as a mask. The etching process is normally a plasma etching. This process is highly selective with respect to polysilicon, so that almost only the dielectric layer 1 is etched. Consequently, a contact window 8 is formed in the dielectric layer 1, the window 8 having substantially the same dimension as the window 7 in the polysilicon layer. Additionally, almost no polymer reaction products are formed during the etching process, so that no etch stop occurs, and the etching of the dielectric layer 1 stops at the surface of the silicon layer 2.

Figure 6:
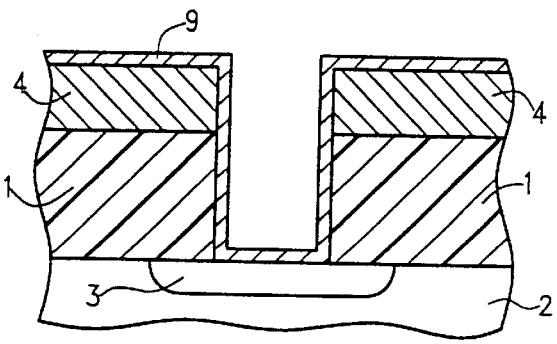

With reference to FIG. 6, a layer of a transition metal 9, preferably titanium or cobalt, preferably together with a transition metal nitride such as titanium nitride, is then deposited. The layer of transition metal 9 covers the exposed polysilicon layer 4, the walls of the windows 7 and 8, and the bottom of window 8.

Figures 7, 8:
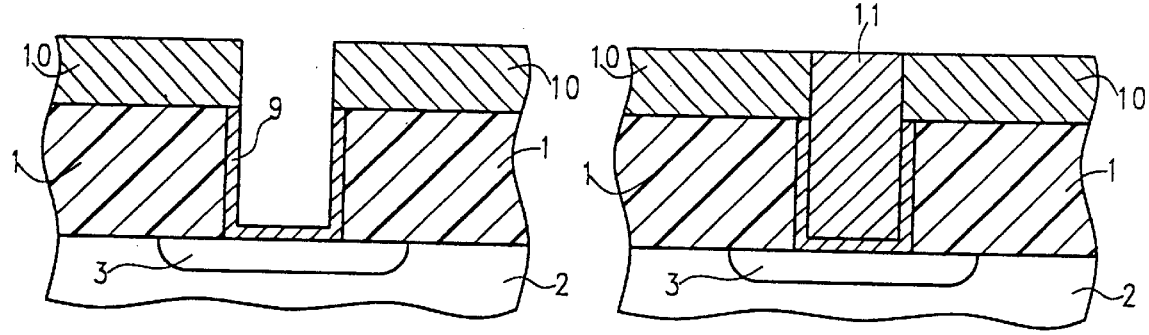

With reference to FIG. 7, a rapid thermal treatment is then performed, e.g. heating the device at a temperature higher than 700° C. for one minute. During the thermal treatment the transition metal, e.g. the titanium, diffuses into the polysilicon, reacts with the latter and a layer of a transition metal silicide 10 such as titanium silicide is formed.

With reference to FIG. 8, tungsten is deposited and then removed, so as to form a tungsten plug 11 inside the contact window. This step is not strictly necessary, and in some cases the tungsten plug 11 is not needed.

Figures 9, 10:
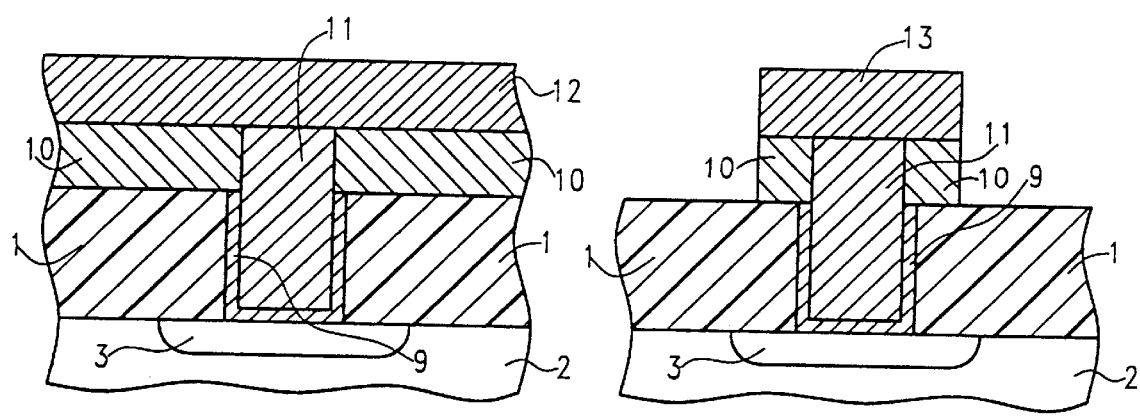

With reference to FIG. 9, a layer of metal 12 is deposited. Then, by means of a conventional mask, the layer of metal 12 is selectively etched and removed to form an interconnection line 13. Conventionally, the etching process for the metal layer uses a chlorine chemistry. During this etching process, not only the metal layer 12, but also the underlying transition metal silicide layer 10 is removed, as shown in FIG. 10.

The main advantages of the process of the invention are: no contamination of the photoresist layer occurs; the lithographic process is very stable; the high selectivity of the etching process of the polysilicon layer allows for reducing the thickness of the photoresist layer, keeping a high focal depth; the chemistry of the dielectric etching is much more selective in respect of polysilicon than in respect of the photoresist material; no removal of the photoresist layer is to be performed after the definition of the contact openings in the dielectric layer, so the contact size is maintained; the polysilicon layer, once converted into a transition metal silicide, is more easily removed. The above advantages are achieved with only two additional steps, one of deposition and one of etching of the polysilicon layer.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Process for etching a dielectric layer, comprising the steps of forming, over the dielectric layer, a layer of polysilicon, forming over the layer of polysilicon a photoresist mask layer, etching the layer of polysilicon using the photoresist mask layer as an etching mask for selectively removing the layer of polysilicon, removing the photoresist mask layer from over the layer of polysilicon, etching the dielectric layer using the layer of polysilicon as a mask, subsequently converting the layer of polysilicon into a layer of a transition metal silicide, and etching the layer of transition metal silicide for selectively removing the latter from over the dielectric layer.

2. Process according to claim 1, wherein the step of converting the layer of polysilicon into the layer of transition metal silicide provides for depositing a transition metal and making the transition metal react with the layer of polysilicon.

3. Process according to claim 2, wherein said transition metal is titanium, and the layer of transition metal silicide is a titanium silicide layer.

4. Process according to claim 2, wherein said transition metal is cobalt, and the layer of transition metal silicide is a cobalt silicide layer.

5. Process according to claim 3, wherein the etching of the dielectric layer defines openings therein.

6. Process according to claim 5, wherein after the conversion of the layer of polysilicon into the layer of transition metal silicide there is provided a deposition of a metal layer, and a selective removal of the metal layer together with the underlying layer of transition metal silicide to define interconnection lines.

7. Process according to claim 6, wherein after the conversion of the layer of polysilicon into the layer of transition metal silicide and before the deposition of the metal layer there is provided the formation of a tungsten plug inside the openings defined in the dielectric layer.

* * * * *